(12) United States Patent
Houben et al.

(10) Patent No.: US 9,939,736 B2
(45) Date of Patent: Apr. 10, 2018

(54) SUBSTRATE HOLDER AND SUPPORT TABLE FOR LITHOGRAPHY

(71) Applicant: ASML Netherlands B.V., Veldhoven (NL)

(72) Inventors: Martijn Houben, 's-Hertogenbosch (NL); Thomas Poiesz, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 28 days.

(21) Appl. No.: 15/111,455

(22) PCT Filed: Nov. 20, 2014

(86) PCT No.: PCT/EP2014/075163
§ 371 (c)(1),
(2) Date: Jul. 13, 2016

(87) PCT Pub. No.: WO2015/106860
PCT Pub. Date: Jul. 23, 2015

(65) Prior Publication Data
US 2016/0334710 A1    Nov. 17, 2016

(30) Foreign Application Priority Data

Jan. 20, 2014  (EP) ..................... 14151736

(51) Int. Cl.
*G03F 7/20*    (2006.01)
*H01L 21/687*  (2006.01)
*H01L 21/683*  (2006.01)

(52) U.S. Cl.
CPC .......... *G03F 7/707* (2013.01); *G03F 7/70783* (2013.01); *H01L 21/6831* (2013.01); *H01L 21/6875* (2013.01); *H01L 21/68742* (2013.01)

(58) Field of Classification Search
CPC . G03F 7/707; G03F 7/70783; H01L 21/6831; H01L 21/68742; H01L 21/6875
See application file for complete search history.

(56) References Cited

U.S. PATENT DOCUMENTS 5,923,408 A * 7/1999 Takabayashi ........... G03F 7/707
                                              269/21
6,184,972 B1 * 2/2001 Mizutani ................. G03F 7/707
                                              269/21
(Continued)

FOREIGN PATENT DOCUMENTS

JP    S63-142829    6/1988
JP    2000-100895   4/2000
(Continued)

OTHER PUBLICATIONS

International Search Report and Written Opinion dated Feb. 18, 2015 in corresponding International Patent Application No. PCT/EP2014/075163.
(Continued)

*Primary Examiner* — Steven H Whitesell Gordon
(74) *Attorney, Agent, or Firm* — Pillsbury Winthrop Shaw Pittman LLP

(57) ABSTRACT

A substrate table supports a substrate holder to which a substrate is clamped for exposure. The substrate table has a plurality of e-pins spaced apart from and distributed around the center of the substrate holder to receive, and lower, a substrate onto the substrate holder prior to exposure, and to raise a substrate off the substrate holder after exposure. Tip portions of the e-pins and the corresponding apertures in the substrate holder have a shape in plan including at least one re-entrant, e.g. a cross shape.

20 Claims, 5 Drawing Sheets

(56) References Cited

U.S. PATENT DOCUMENTS

| | | |
|---|---|---|
| 7,110,085 B2 | 9/2006 | Zaal et al. |
| 7,110,091 B2 | 9/2006 | Zaal et al. |
| 7,227,619 B2 | 6/2007 | Zaal et al. |
| 7,701,550 B2 | 4/2010 | Kemper et al. |
| 7,705,962 B2 | 4/2010 | Kemper et al. |
| 8,351,018 B2 | 1/2013 | Direcks et al. |
| 8,421,993 B2 | 4/2013 | Direcks et al. |
| 8,485,507 B2 | 7/2013 | Inoue et al. |
| 8,634,053 B2 | 1/2014 | Riepen et al. |
| 2004/0247361 A1 | 12/2004 | Zaal et al. |
| 2005/0030512 A1 | 2/2005 | Zaal et al. |
| 2005/0219499 A1 | 10/2005 | Zaal et al. |
| 2006/0038968 A1 | 2/2006 | Kemper et al. |
| 2006/0158627 A1 | 7/2006 | Kemper et al. |
| 2008/0212046 A1 | 9/2008 | Riepen et al. |
| 2009/0279060 A1 | 11/2009 | Direcks et al. |
| 2009/0279062 A1 | 11/2009 | Direcks et al. |
| 2010/0276858 A1 | 11/2010 | Inoue et al. |
| 2014/0004710 A1 | 1/2014 | Sakata et al. |

FOREIGN PATENT DOCUMENTS

| | | |
|---|---|---|
| JP | 2001-185607 | 7/2001 |
| JP | 2007-273693 | 10/2007 |
| JP | 2011-114238 | 6/2011 |
| TW | 201236078 | 9/2012 |
| WO | 99/49504 | 9/1999 |

OTHER PUBLICATIONS

Japanese Office Action dated Apr. 18, 2017 in corresponding Japanese Patent Application No. 2016-547550.
Chinese Office Action dated Sep. 4, 2017 in corresponding Chinese Patent Application No. 201480073555.7.
Korean Office Action dated Nov. 22, 2017 in corresponding Korean Patent Application No. 10-2016-7021302.

* cited by examiner

SUBSTRATE HOLDER AND SUPPORT TABLE FOR LITHOGRAPHY

CROSS-REFERENCE TO RELATED APPLICATIONS

This application is the U.S. national phase entry of PCT patent application no. PCT/EP2014/075163, which was filed on Nov. 20, 2014, which claims the benefit of priority of European Patent application no. EP14151736.7, which was filed on 20 Jan. 2014, and which is incorporated herein in its entirety by reference.

FIELD

The present invention relates to substrate holder, a support table for a lithographic apparatus, a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

SUMMARY

During exposure, the substrate must be held firmly to prevent shifts as a substrate table on which it is held is moved. The substrate must also be kept flat to tight tolerances. It is conventional to clamp the substrate to a substrate holder using an electrostatic clamp or a vacuum clamp. The substrate holder is similarly clamped to the substrate table. The substrate holder has a large number of burls projecting from a surface thereof to support the substrate. The distal ends of the burls are accurately formed to be coplanar to meet the flatness requirements on the substrate.

The substrate must be loaded onto and removed from the substrate holder quickly in order to not reduce the throughput of the lithographic apparatus. Conventionally, elevator pins, commonly called e-pins, which project through holes in the substrate holder from the substrate table beneath, are provided. When a substrate is to be loaded, the e-pins are projected to receive the substrate, which is carried on the tines of a substrate handler, at a distance above the substrate holder. The substrate handler can then be withdrawn and the e-pins retracted to lower the substrate onto the substrate holder. After exposure, the e-pins are extended to raise the substrate so the tines of the substrate handler can be inserted beneath the substrate to pick it up.

In recent years, the standard size of silicon substrate on which semiconductor devices are manufactured has increased from 200 mm diameter to 300 mm diameter. To support larger diameter substrates, multiple e-pins are used, the e-pins being spaced apart from and distributed around the center of the substrate holder. It is now possible to manufacture silicon substrates of diameter 450 mm with the required quality for semiconductor device manufacture. Therefore, lithographic apparatus and process apparatus capable of handling 450 mm diameter substrates are being developed. The need to handle larger substrates and/or thinner substrates as well as continuing demand for improvements in substrate flatness place increasing demands on the performance of the e-pins and the substrate holder.

It is desirable, for example, to provide an improved arrangement of substrate holder and e-pins.

According to an aspect of the invention, there is provided a substrate holder having: an upper surface; a plurality of burls located on and distributed across the upper surface, the burls being configured to support a substrate thereon; and a plurality of apertures in the substrate holder, the apertures being spaced apart from the center of the substrate holder; wherein at least one of the apertures has a shape at the upper surface of the substrate holder that includes at least one re-entrant, and at least one burl is located within the re-entrant.

According to an aspect of the invention, there is provided a lithographic apparatus, a substrate table arranged to support a substrate holder, the substrate table comprising: a plurality of spaced apart e-pins; an actuator system for controlling a projection of each e-pin into and/or through a respective aperture in the substrate holder; wherein each e-pin has a tip portion at a distal end thereof and the cross-section of the tip portion in a plane parallel to an upper surface of the substrate holder has at least one re-entrant.

According to an aspect of the invention, there is provided a lithographic apparatus including a substrate holder as described above and a substrate table as described above.

According to an aspect of the invention, there is provided a device manufacturing method, comprising using a lithographic apparatus to transfer a pattern from a patterning device to a substrate, wherein the lithographic apparatus is as described above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
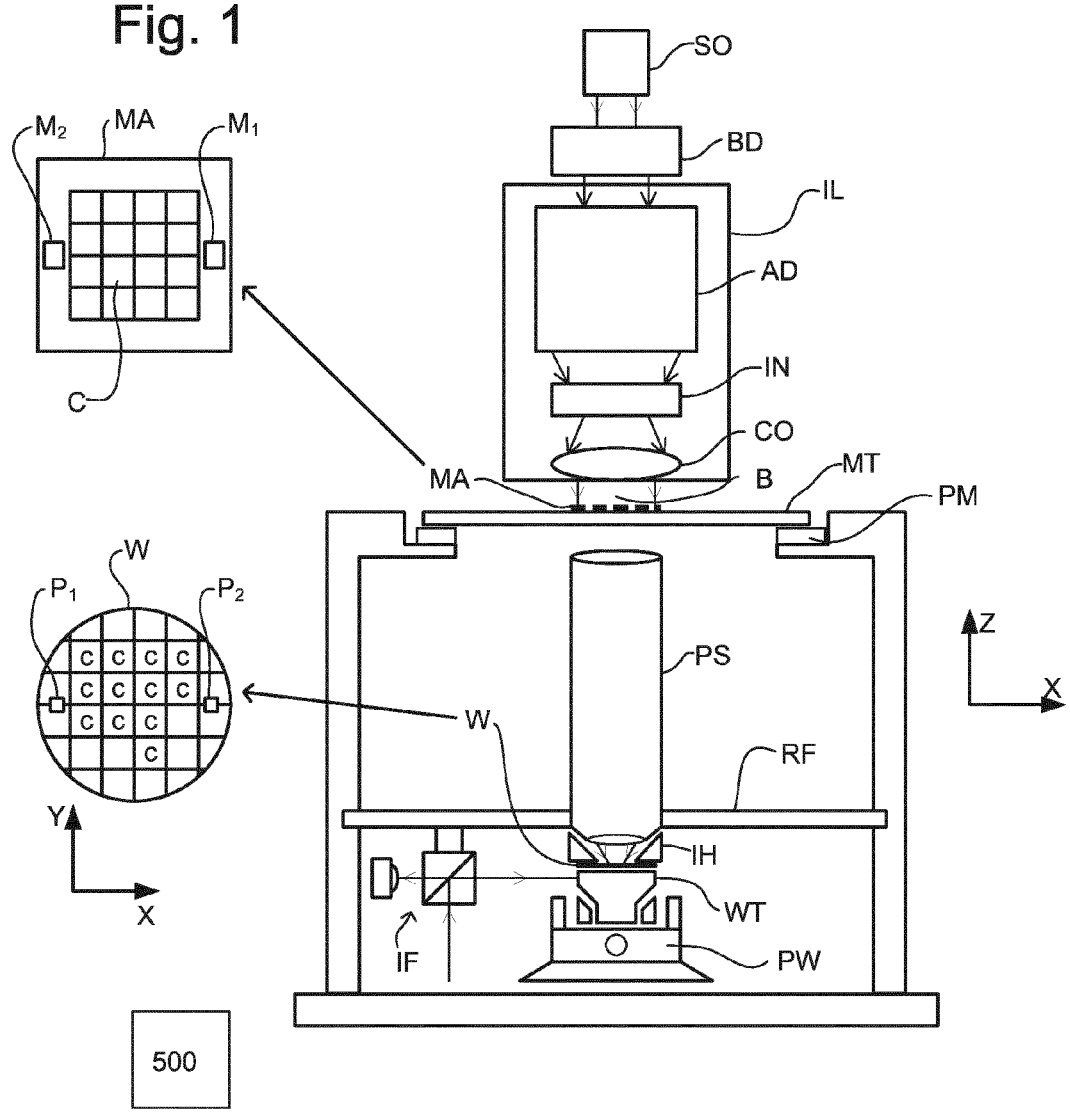
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more substrate tables or a combination of one or more substrate tables and one or more cleaning, sensor or measurement tables. For example, in an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In such "multiple stage" (or "multi-stage") machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, cleaning, sensor and/or measurement tables.

In an embodiment, the lithographic apparatus may comprise an encoder system to measure the position, velocity, etc. of a component of the apparatus. In an embodiment, the component comprises a substrate table. In an embodiment, the component comprises a measurement and/or sensor and/or cleaning table. The encoder system may be in addition to or an alternative to the interferometer system described herein for the tables. The encoder system comprises a sensor, transducer or readhead associated, e.g., paired, with a scale or grid. In an embodiment, the movable component (e.g., the substrate table and/or the measurement and/or sensor and/or cleaning table) has one or more scales or grids and a frame of the lithographic apparatus with respect to which the component moves has one or more of sensors, transducers or readheads. The one or more of sensors, transducers or readheads cooperate with the scale(s) or grid(s) to determine the position, velocity, etc. of the component. In an embodiment, a frame of the lithographic apparatus with respect to which a component moves has one or more scales or grids and the movable component (e.g., the substrate table and/or the measurement and/or sensor and/or cleaning table) has one or more of sensors, transducers or readheads that cooperate with the scale(s) or grid(s) to determine the position, velocity, etc. of the component.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-6 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
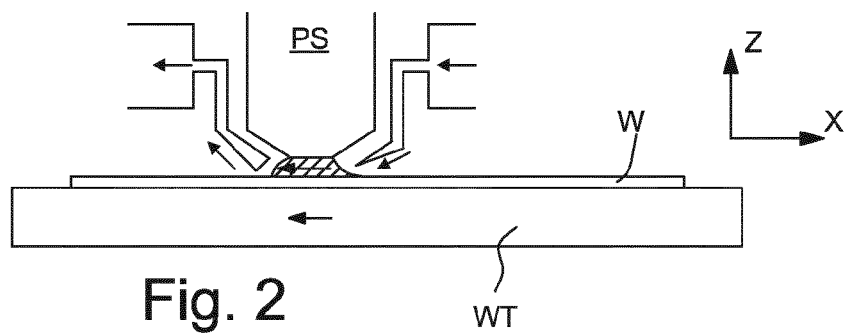
FIGS. 2 and 3 depict a liquid supply system for use in a lithographic projection apparatus.
Figure 3:
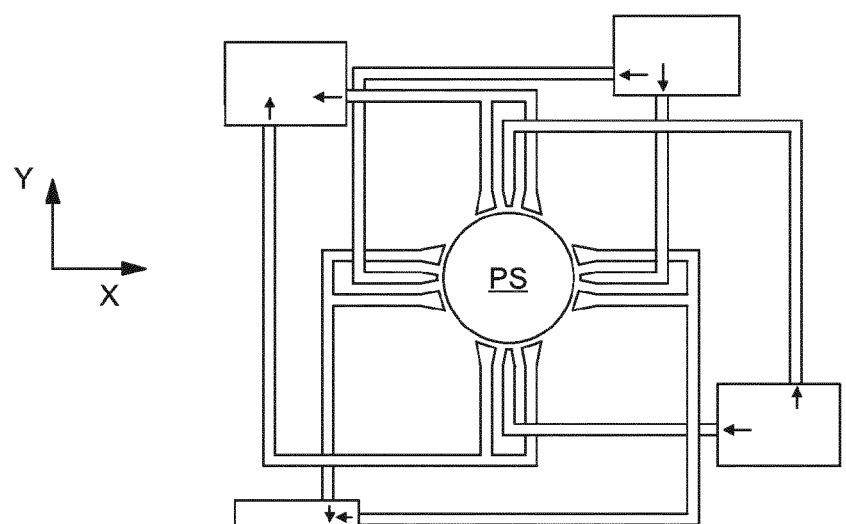

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
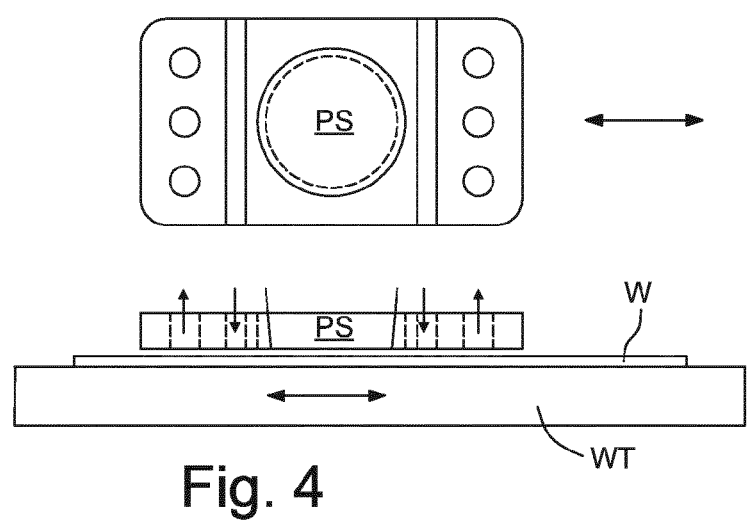
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

In an embodiment, the lithographic apparatus comprises a liquid confinement structure that has a liquid removal device having an inlet covered with a mesh or similar porous material. The mesh or similar porous material provides a two-dimensional array of holes contacting the immersion liquid in a space between the final element of the projection system and a movable table (e.g., the substrate table). In an embodiment, the mesh or similar porous material comprises a honeycomb or other polygonal mesh. In an embodiment, the mesh or similar porous material comprises a metal mesh. In an embodiment, the mesh or similar porous material extends all the way around the image field of the projection system of the lithographic apparatus. In an embodiment, the mesh or similar porous material is located on a bottom surface of the liquid confinement structure and has a surface facing towards the table. In an embodiment, the mesh or similar porous material has at least a portion of its bottom surface generally parallel with a top surface of the table.

Figure 5:
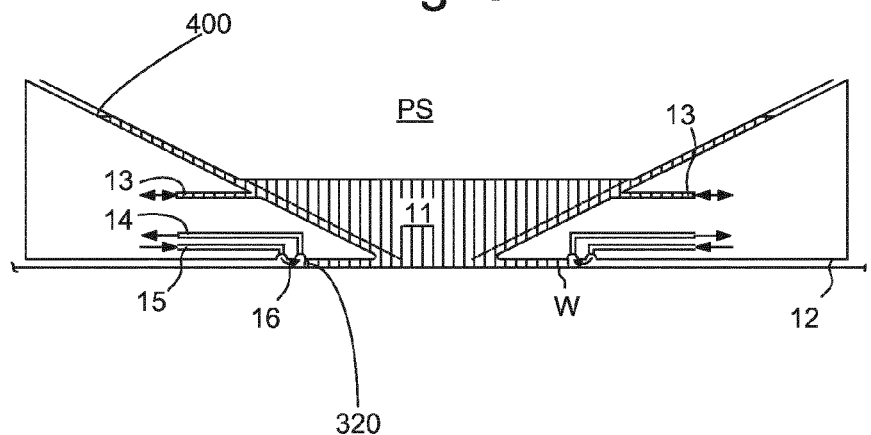
FIG. 5 depicts a further liquid supply system for use in a lithographic projection apparatus.

FIG. 5 schematically depicts a localized liquid supply system or fluid handling structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the fluid handling structure 12 and the surface of the substrate W and may be a contactless seal such as a gas seal (such a system with a gas seal is disclosed in European patent application publication no. EP-A-1,420,298) or liquid seal.

The fluid handling structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the fluid handling structure 12 positioned below and surrounding the final element of the projection system PS. Liquid is brought into the space below the projection system PS and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the fluid handling structure 12 and the surface of the substrate W. The gas seal is formed by gas. The gas in the gas seal is provided under pressure via inlet 15 to the gap between the fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the fluid handling structure 12 does not have a gas seal.

Figure 6:
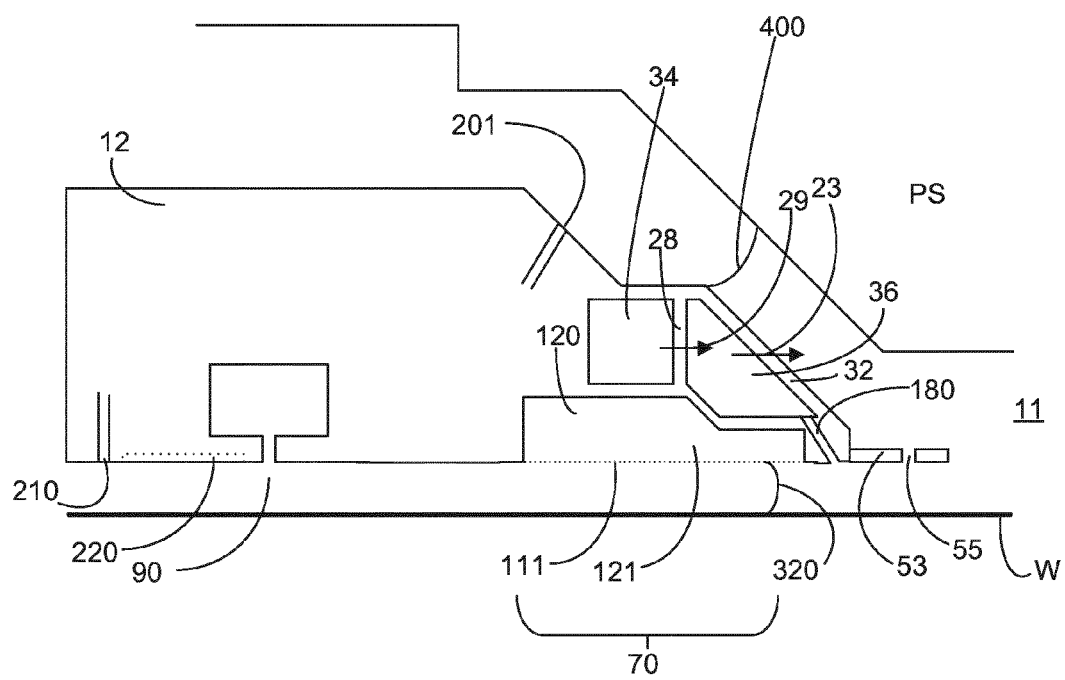
FIG. 6 depicts, in cross-section, a further liquid supply system for use in a lithographic projection apparatus.

FIG. 6 illustrates a fluid handling structure 12 which is part of a liquid supply system. The fluid handling structure 12 extends around the periphery (e.g. circumference) of the final element of the projection system PS.

A plurality of openings 23 in the surface which in part defines the space 11 provides the liquid to the space 11. The liquid passes through openings 29, 23 in side walls 28, 32 respectively through respective chambers 34, 36 prior to entering the space 11.

A seal is provided between the bottom of the fluid handling structure 12 and a facing surface, e.g. the substrate W, or a substrate table WT, or both. In FIG. 6 a seal device is configured to provide a contactless seal and is made up of several components. Radially outwardly from the optical axis of the projection system PS, there is provided a (optional) flow control plate 53 which extends into the space 11. The control plate 53 may have an opening 55 to permit flow liquid therethrough; the opening 55 may be beneficial if the control plate 53 is displaced in the Z direction (e.g., parallel to the optical axis of the projection system PS). Radially outwardly of the flow control plate 53 on the bottom surface of the fluid handling structure 12 facing (e.g., opposite) the facing surface, e.g., the substrate W, may be an opening 180. The opening 180 can provide liquid in a direction towards the facing surface. During imaging this may be useful in preventing bubble formation in the immersion liquid by filling a gap between the substrate W and substrate table WT with liquid.

Radially outwardly of the opening 180 may be an extractor assembly 70 to extract liquid from between the fluid handling structure 12 and the facing surface. The extractor assembly 70 may operate as a single phase or as a dual phase extractor. The extractor assembly 70 acts as a meniscus pinning feature of a meniscus 320 of the liquid.

Radially outwardly of the extractor assembly may be a gas knife 90. An arrangement of the extractor assembly and gas knife is disclosed in detail in United States patent application publication no. US 2006/0158627 incorporated herein in its entirety by reference.

The extractor assembly 70 as a single phase extractor may comprise a liquid removal device, extractor or inlet such as the one disclosed in United States patent application publication no. US 2006-0038968, incorporated herein in its entirety by reference. In an embodiment, the liquid removal device 70 comprises an inlet 120 which is covered in a porous material 111 which is used to separate liquid from gas to enable single-liquid phase liquid extraction. An underpressure in chamber 121 is chosen such that the meniscuses formed in the holes of the porous material 111 prevent ambient gas from being drawn into the chamber 121 of the liquid removal device 70. However, when the surface of the porous material 111 comes into contact with liquid there is no meniscus to restrict flow and the liquid can flow freely into the chamber 121 of the liquid removal device 70.

The porous material 111 has a large number of small holes each with a dimension, e.g. a width, such as a diameter, in the range of 5 to 50 micrometers. The porous material 111 may be maintained at a height in the range of 50 to 300 micrometers above a surface, such as a facing surface, from which liquid is to be removed, e.g. the surface of a substrate W. In an embodiment, porous material 111 is at least slightly liquidphilic, i.e. having a dynamic contact angle of less than 90°, desirably less than 85° or desirably less than 80°, to the immersion liquid, e.g. water.

Radially outward of gas knife 90 may be provided one or more outlets 210 to remove gas from gas knife 90 and/or liquid that may escape past the gas knife 90. The one or more outlets 210 may be located between one or more outlets of the gas knife 90. To facilitate channeling of fluid (gas and/or liquid) to the outlet 210, a recess 220 may be provided in the liquid confinement structure 12 that is directed toward outlet 210 from outlets of the gas knife 90 and/or from between outlets of the gas knife 90.

Although not specifically illustrated in FIG. 6, the liquid supply system has an arrangement to deal with variations in the level of the liquid. This is so that liquid which builds up between the projection system PS and the liquid confinement structure 12 (and forms a meniscus 400) can be dealt with and does not escape. One way of dealing with this liquid is to provide a lyophobic (e.g., hydrophobic) coating. The coating may form a band around the top of the fluid handling structure 12 surrounding the opening and/or around the last optical element of the projection system PS. The coating may be radially outward of the optical axis of the projection system PS. The lyophobic (e.g., hydrophobic) coating helps keep the immersion liquid in the space 11. Additionally or alternatively, one or more outlets 201 may be provided to remove liquid reaching a certain high relative to the structure 12.

Another localized area arrangement is a fluid handling structure which makes use of a gas drag principle. The so-called gas drag principle has been described, for example, in United States patent application publication nos. US 2008-0212046, US 2009-0279060 and US 2009-0279062. In that system the extraction holes are arranged in a shape which may desirably have a corner. The corner may be aligned with a preferred direction of movement, such as the stepping or the scanning direction. This reduces the force on the meniscus between two openings in the surface of the fluid handing structure for a given speed in the preferred direction compared to if the two outlets were aligned perpendicular to the preferred direction. However, an embodiment of the invention may be applied to a fluid handling system which in plan has any shape, or has a component such as the extraction openings arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star.

In a variation of the system of US 2008/0212046 A1, to which an embodiment of the present invention may relate, the geometry of the cornered shape in which the openings are arranged allows sharp corners (between about 60° and 90°, desirably between 75° and 90° and most desirably between 75° and 85°) to be present for the corners aligned both in the scan and in the stepping directions. This allows increased speed in the direction of each aligned corner. This is because the creation of liquid droplets due to an unstable meniscus, for example in exceeding a critical speed, in the scanning direction is reduced. Where corners are aligned with both the scanning and stepping directions, increased speed may be achieved in those directions. Desirably the speed of movement in the scanning and stepping directions may be substantially equal.

For exposure, a substrate is held on a substrate holder which is in turn supported on a substrate table. In an embodiment, the substrate holder is configured to support a lower surface of the substrate. The substrate holder includes a base surface having a plurality of burls protruding from the base surface. The lower surface of the substrate may be supported on the upper faces of the burls. The burls can be manufactured accurately so that their distal ends, which support the substrate, are accurately coplanar and help to ensure that the substrate is held sufficiently flat. Such an arrangement may also minimize or reduce the total area of the substrate in contact with the substrate holder, minimizing or reducing the likelihood of contaminants being transferred between the support table and the substrate and/or minimizing or reducing the likelihood of a contaminant being located at a position where the substrate is to contact the substrate holder, which may result in a deformation of the substrate.

In an embodiment, the space around the burls, below the substrate, may be connected to an under-pressure source. Accordingly, the substrate may be vacuum clamped to the substrate holder. The substrate holder is in turn clamped to the substrate table. In an embodiment, an electrostatic clamp system is provided to clamp the substrate to the substrate holder and/or the substrate holder to the substrate table.

With the continual desire in this art to produce structures of smaller dimensions, requirements on the flatness of the substrate when held in the apparatus for imaging become ever stricter. The present inventors have determined that one source of deviations from flatness (such deviations are sometimes referred to as unflatness) in existing designs of a substrate table are the apertures in the substrate holder through which the e-pins project to receive, lower and raise the substrate. These apertures are known as e-pin apertures. In a known design, the pitch (center to center distance) of the burls is about 1 to 3 mm. The tips of the e-pins have a diameter of 4 mm or more and corresponding e-pin apertures in the substrate holder have a diameter of about 7.5 mm. Around each e-pin aperture, a raised wall or ridge forming a gas seal is provided to reduce the leakage of gas into the evacuated space between substrate and substrate holder through the e-pin apertures. As a result, there is a span of about 11 to 13 mm over which the substrate is unsupported. In spite of the stiffness of the substrate, this unsupported span can result in undesirable deflections of the upper surface of the substrate. This unflatness can lead to distortion or displacement of device features formed in the vicinity of the e-pin apertures, which leads to reduced yield.

In a first aspect of the present invention, a substrate holder has an upper surface; a plurality of burls located on and distributed across the upper surface, the burls being configured to support a substrate thereon; and a plurality of apertures, the apertures being spaced apart from the center of the substrate holder; wherein at least one of the apertures has a shape at the upper surface of the substrate holder that includes at least one re-entrant and at least one burl is located within the re-entrant.

By arranging the shape of an aperture to have at least one re-entrant, i.e. having at least one vertex pointing inwards, and positioning a burl within that re-entrant, i.e. in the angle between the sides adjacent the inward pointing vertex, the unsupported span can be reduced. Unflatness of the substrate is reduced and yield can be increased. The shape of the aperture at the upper surface is the cross-section of the aperture in the plane of the upper surface. The cross-section of the aperture need not be constant in shape or size away from the upper surface. A re-entrant is necessarily located between two salients, i.e. vertexes pointing outwards. A burl may be regarded as within a re-entrant if the burl is closer to the center of the aperture than is an imaginary straight line joining the two adjacent salients. In an embodiment of the present invention, sides of the shape of the aperture defining the re-entrant need not be straight lines. In a case where the sides of the shape of the aperture are curved, the re-entrant can be described as a concavity.

In an embodiment of the invention, each aperture extends through the substrate holder to a lower surface thereof to create a through hole. In an embodiment of the invention, at least one aperture is configured to receive a respective e-pin. In an embodiment of the invention at least one aperture is configured to be connected to a vacuum source. In an embodiment of the invention there are other apertures in the substrate holder having shapes that do not include a re-entrant.

In a second aspect of the present invention, the shape of at least one aperture has at least one degree of symmetry and a plurality of re-entrants.

In a third aspect of the present invention, the shape of at least one aperture has two degrees of reflectional and/or rotational symmetry and there are four re-entrants.

In a fourth aspect of the present invention at least one aperture is cross-shaped.

In a fifth aspect of the invention there are at least three apertures having shapes at the upper surface that include at least one re-entrant.

In a sixth aspect of the present invention, a substrate table is adapted to support a substrate holder and has a plurality of spaced-apart e-pins and an actuator system for controlling a projection of each e-pin into and/or through a respective aperture in the substrate holder, wherein each e-pin has a tip portion at a distal end thereof and the cross-section of the tip portion in a plane parallel to an upper surface of the substrate holder has at least one re-entrant. In an embodiment, the substrate holder is integrated into the substrate table so that the substrate holder and substrate table form one component. In an embodiment, e-pins are integrated into the substrate holder.

Figure 7:
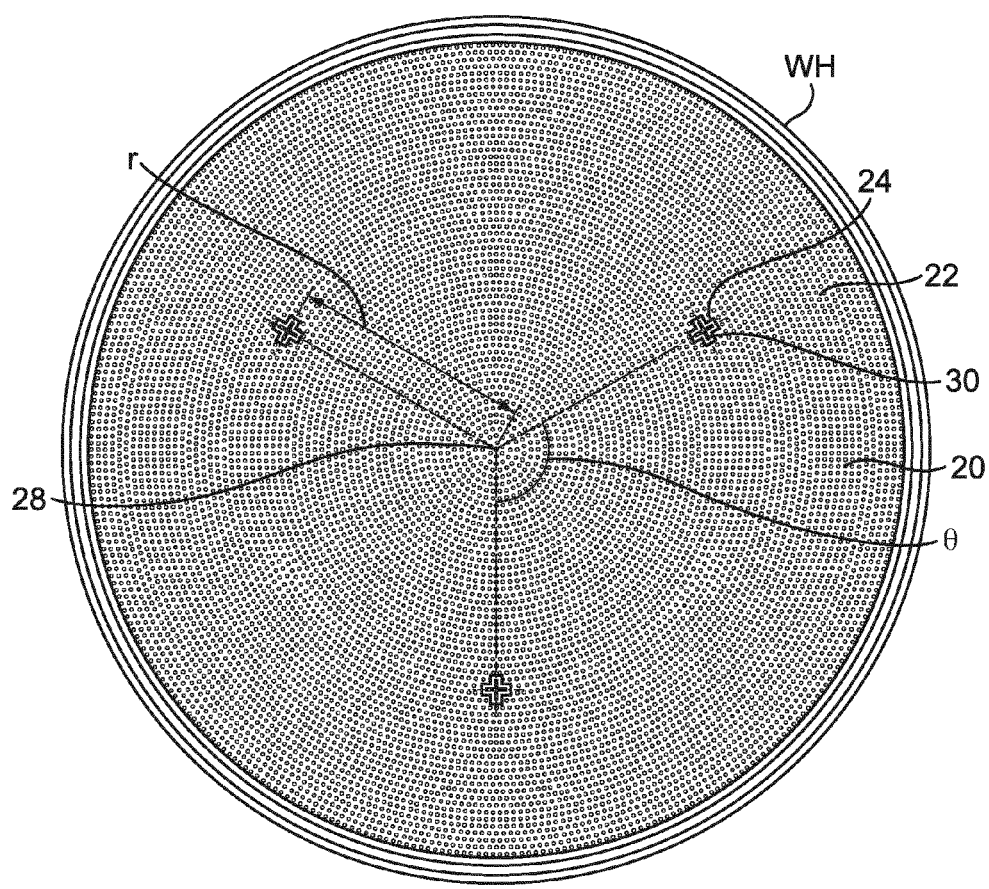
FIG. 7 depicts, in plan, a substrate holder for a lithographic apparatus.

FIG. 7 depicts a substrate holder WH for a lithographic apparatus. The substrate holder WH is configured to support a lower surface of a substrate W. The substrate holder WH is supported by support table WT (not shown in FIG. 7).

The substrate holder WH has an upper surface 22. The substrate holder WH comprises a plurality of burls 20. The burls 20 protrude above the upper surface 22. Each of the plurality of burls 20 has a respective distal end. The burls 20 are arranged such that, when a substrate W is supported by the support holder WH, the substrate W is supported by the respective distal end of each of the plurality of the burls 20. When so supported, the substrate is substantially parallel to the upper surface 22. In an embodiment the substrate W is in contact with only the distal ends of the burls 20. The burls are manufactured with sufficient accuracy that their distal ends are coplanar with a tolerance small enough to meet flatness requirements on the substrate during exposure.

The burls 20 are used to hold the substrate W to the substrate holder WH with relatively low area of contact between the substrate W and the substrate holder WH. For example, from about 1% to about 3% of the area of the substrate W is in contact with the burls 20. By having a low area of contact, contamination sensitivity is reduced.

To be exposed, a substrate W is held by the substrate holder WH. In particular, the substrate W may be clamped to the substrate holder WH. The clamping may be effected by having the space between the substrate W and the substrate holder WH at a lower pressure compared to ambient pressure (i.e. the pressure of the gas, e.g. air, surrounding the substrate W and the support holder WH). The region enclosed by the substrate holder WH and the substrate W may be at near vacuum pressure such that the substrate W is vacuum clamped to the substrate holder WH.

In an embodiment the substrate holder WH comprises one or more vacuum holes (not shown in the figure), in this case three, formed therein. The holes communicate with a vacuum source via the support table WT. Gas may be extracted through the holes from the region enclosed by the substrate W and the substrate holder WH, thereby reducing the pressure in this space for clamping of the substrate W. The vacuum holes can be made small enough, e.g. of the same order as the pitch of the burls, that no significant unsupported span arises. If it were to be desirable to provide larger vacuum holes, e.g. to increase the rate of flow of gas, the vacuum holes can be made in a shape with at least one re-entrant in the same way as the e-pin apertures described below. Any other holes in the substrate table that are desirable can also be formed in a shape with at least one re-entrant.

Substrate holder WH also includes a plurality of apertures 24, in this case three, to receive e-pins to be used in receiving, lowering and raising the substrate W. These apertures are referred to below as e-pin apertures. In an embodiment of the invention, there are four, five or six e-pin apertures. The e-pin apertures 24 are spaced apart from the center 28 of the substrate holder WH and from each other. In an embodiment, each of the e-pin apertures 24 is disposed at a distance r (measured to its center) from the center of the substrate holder WH imaginary lines from the center of the substrate holder WH to the centers of adjacent e-pin apertures 24 subtend the same angle θ. In an embodiment r is equal to or more than ¼ of the radius of the substrate holder. In an embodiment r is equal to or less than ¾ of the radius of the substrate holder. Thus, the e-pin apertures are equally spaced around an imaginary circle centered on the center of the substrate holder WH. This arrangement serves to evenly distribute the forces exerted on the substrate when raising or lowering it via the e-pins.

Figure 8:
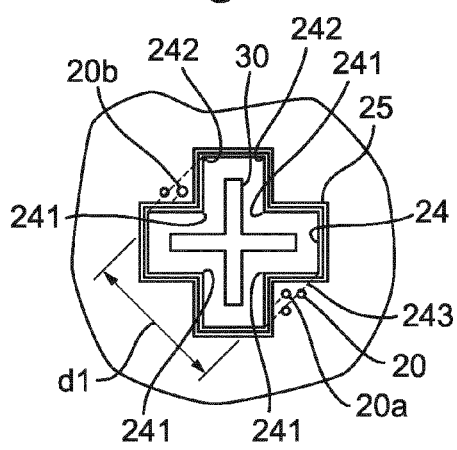
FIG. 8 depicts, in plan, an e-pin projecting through a substrate holder according to an embodiment of the invention.

FIG. 8 is an enlarged view of one of the e-pin apertures 24. It will be seen that e-pin aperture 24 has a re-entrant polygonal shape, specifically there are four re-entrant vertices 241 and eight salients 242 and the overall shape of the e-pin aperture 24 is that of a cross. Surrounding the e-pin aperture is a gas seal 25, which takes the form of a raised wall or ridge, closely following the edge of the aperture 24. For manufacturing reasons, the ridge 25 may need to be spaced a small distance from the edge of the e-pin aperture 24 where it meets the upper surface of the substrate holder but it is desirable that this distance is minimized. The ridge 25 serves to reduce the leakage of gas through the e-pin aperture 24 when a substrate is held on the substrate holder WH using vacuum clamping. The ridge 25 has a height relative to a base surface of the substrate holder WH a little less than that of the burls 20. Ridge 25 can be omitted if not desired, e.g. if an electrostatic clamp is used.

As can be seen in FIG. 8, at least one burl 20a, 20b is placed within the angle of the sides of aperture 24 at the re-entrant vertex 241. For clarity, only a few burls are shown in FIG. 8, many others will be present in the vicinity of aperture 24. It can be seen that burls 20a, 20b, are closer to the center of the e-pin aperture 24 than the line joining the adjacent salient vertices 242. In this way, the unsupported span of a substrate W supported by the substrate holder WH between burls 20a, 20b, that is the distance d1 in FIG. 8, is less than could be obtained with an e-pin aperture having a non-reentrant shape of the same area and aspect ratio.

Figure 12:
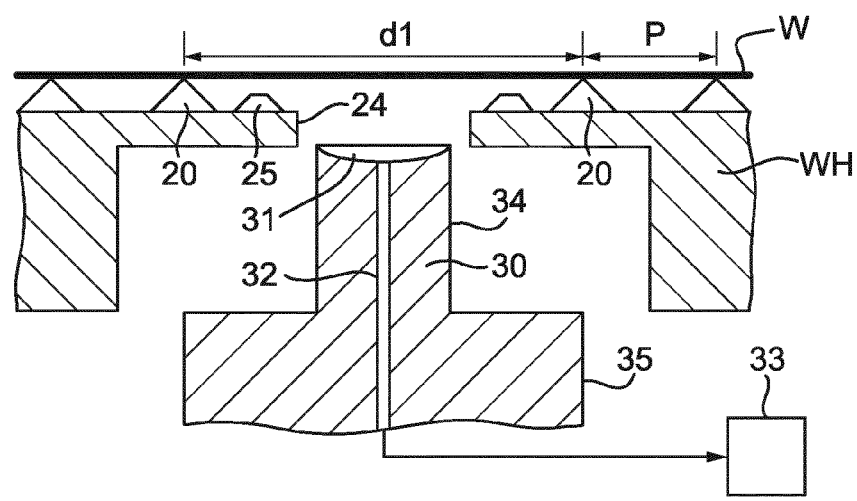
FIG. 12 depicts, in cross-section, an e-pin in a lowered position projecting into a support table according to an embodiment of the invention.
Figure 13:
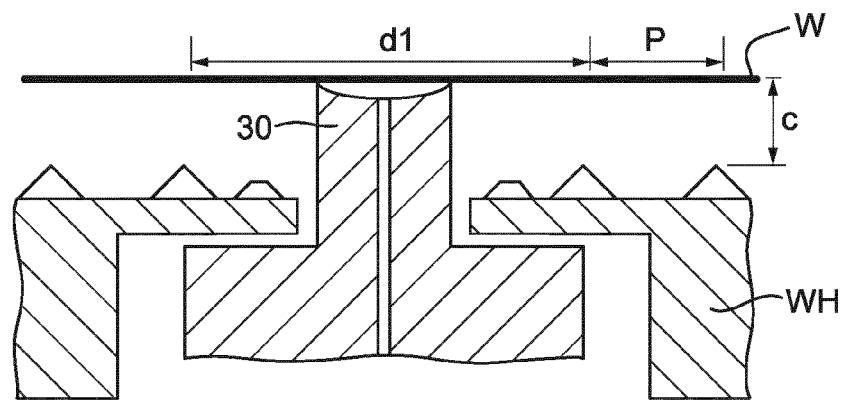
FIG. 13 depicts the arrangement of FIG. 12 with the e-pin in a raised position.

FIGS. 12 and 13 are cross-sectional views showing the operation of an e-pin 30 to raise a substrate W. In FIG. 12, e-pin 30 is shown in a retracted position and the distal end 31 is below the level of the upper surface 22 of the substrate holder WH. The substrate W is therefore supported on the distal ends of the burls 20. In FIG. 13, the e-pin 30 is shown in a projected position and the substrate W is lifted off the burls 20 to provide a clearance c. The tines of a substrate handler can then be inserted underneath the substrate W to lift the substrate W away from substrate holder WH during substrate exchange.

It can also be seen in FIGS. 12 and 13 that the e-pin 30 has a tip portion 34 at its distal end and a main body portion 35 that has a larger diameter than the tip. The e-pin aperture 24 is similarly narrow at the upper surface of the substrate holder WH but larger below that. In the lower, wider part of the e-pin aperture 24 there is greater clearance between the retracted e-pin and the aperture size. This greater clearance reduces the likelihood of damage to the substrate holder or e-pin in the event of excessive accelerations or decelerations of the substrate table.

It can also be seen in FIGS. 12 and 13 that the distal end of each e-pin 30 has a dish-shaped depression 31 that is connected via a conduit 32 to a vacuum source 33. This may be the same vacuum source as is used to clamp substrate W to substrate holder WH or the vacuum source may be a separate vacuum source. Vacuum source 33 is operated when e-pins 30 are in contact with the substrate W so that the substrate W is clamped to the e-pins by the pressure differential between the atmosphere above the substrate and the reduced pressure within depression 31. By clamping the substrate to the e-pins during the raising operation and lowering operation, undesirable lateral movements of the substrate W are avoided. In particular, this clamping enables a pre-alignment of the substrate to be maintained as the substrate is received on to the substrate holder WH. To provide sufficient clamping force to avoid lateral movement of the substrate, the distal ends of e-pins 30 must have a sufficient area in plan. In an embodiment of the invention the area of the end of the e-pin is greater than about 8 mm². In an embodiment of the invention, the area of the distal end of each e-pin is greater than about 10 mm². In an embodiment of the invention the area of the distal end of each e-pin is greater than about 12 mm². In an embodiment of the invention the total area of the distal ends of all e-pins is greater than about 33 mm².

Figure 9:
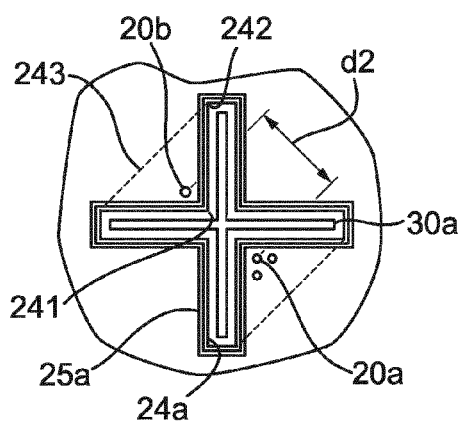
FIG. 9 depicts, in plan, an e-pin projecting through a substrate holder according to an embodiment of the invention.

FIG. 9 shows the tip of an e-pin 30a and the corresponding e-pin aperture 24a in another embodiment of the invention. The tip of the e-pin 30a is again cross-shaped in plan and aperture 24a has a corresponding shape. In the embodiment of FIG. 9, the arms of the cross-shape of both the e-pin 30a and e-pin aperture 24a are narrower and more elongated than in the embodiment of FIG. 8. This makes the re-entrant at inward pointing vertex 241 deeper and reduces the unsupported span of the substrate W, indicated in FIG. 9 by distance d2. In addition, multiple burls 20a can be located within the re-entrant, defined by the sides of aperture 24 and the imaginary line 243 joining adjacent salient vertices 242. Again, only a few of the many burls that are in the vicinity of aperture 24 are shown in FIG. 9.

It will be seen that in the embodiments of FIGS. 8 and 9 the cross-shaped e-pins and the corresponding e-pin apertures 24 have four arms that are of the same length and width. Therefore, the aspect ratio of the e-pin tips and the e-pin apertures is 1:1. This is desirable to evenly distribute loads on the substrate when raising and lowering it. If the e-pin tips and e-pin apertures have an aspect ratio of 1:1, they can be manufactured more easily than if the aspect ratio is higher. In an embodiment, the aspect ratio of the e-pin tips and the e-pin apertures is less than about 2:1, desirably less than 4:3.

The lengths and widths of the arms of a cross-shaped e-pin are constrained by manufacturing issues and strength issues as well as the need to provide a sufficient area to the tips of the e-pins for clamping. In an embodiment, the arms of the e-pin have a width greater than or equal to about 0.25 mm, desirably greater than about 0.5 mm. In an embodiment, the width of the arms is less than about 2 mm, desirably less than about 1 mm. In an embodiment of the invention, the arms of the e-pin tip have a length equal to or greater than about 3 mm, desirably equal to or greater than about 2 mm. In an embodiment, the length of the arms is equal to or less than 8 mm, desirably equal to or less than 6 mm. The lengths and widths of the arms of a cross-shaped e-pin determine their stiffness. Shorter and fatter arms are stiffer and less fragile, which can be desirable.

Other shapes than the simple cross shapes shown in FIGS. 8 and 9 can be used in embodiments of the invention. For example, in an embodiment of the invention the tip of the e-pin has an enlarged central portion at the intersection of the arms formed e.g. by superimposing a square or circle on the intersection or by rounding the corners between the arms. The latter case allows the area of the e-pin tip to be increased whilst maintaining a constant clearance to a square cornered aperture. In an embodiment of the invention, the arms of the cross are not of constant width, for example the arms can increase in width with increasing distance from the intersection. The increase in width can be linear with distance from the center to produce straight sides or non-linear so that the sides of the arms are curved. The ends of the arms may be provided with enlargements, e.g. in the form of circular knobs or crossbars.

Figure 10:
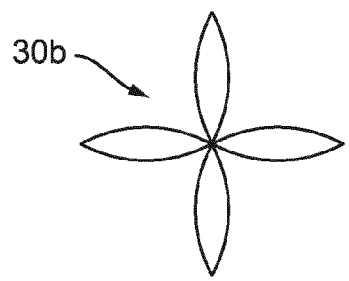
FIG. 10 depicts, in plan, the tip of an e-pin according to an embodiment of the invention.
Figure 11:
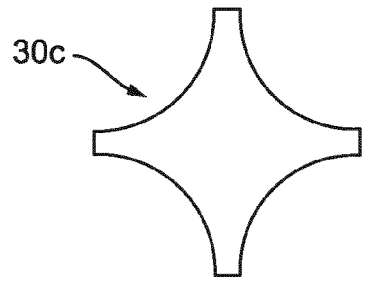
FIG. 11 depicts, in plan, the tip of an e-pin according to an embodiment of the invention.

FIGS. 10 and 11 illustrate examples of other shapes that may be used for the tips of the e-pins in embodiments of the invention. In FIG. 10 the arms of the e-pin have the shape of petals with curved sides leading to points. The overall length and maximum width of such petals can be the same as indicated above for straight sided crosses. In the embodiment of FIG. 11, the tip of the e-pin has a shape formed as square with an arcuate notch at each corner. This shape can also be described as an extreme case of rounding of the corners where the arms of a cross meet.

In the embodiments of the invention illustrated and described above, there are four arms or petals in the shape of the tip of the e-pin. In an embodiment of the invention there can be more or fewer arms or petals. In particular, an embodiment of the invention can have three, four or five arms or petals. In an embodiment of the invention, the angles between each pair of adjacent arms or tips are equal. In an embodiment, the angles between adjacent arms or tips are not all the same.

In an embodiment of the invention, the clearance between the edge of the aperture and the tips of the e-pin when projecting through the e-pin aperture is as small as possible. The necessary clearance may be reduced by improved manufacturing techniques and/or by improved positional accuracy in the placement of the substrate holder on the support table WT. In an embodiment of the invention, the clearance between the e-pin tip and the edge of the aperture is in the range of from 1 mm to 4 mm, desirably in the range of from 1.5 mm to 3.5 mm.

In an embodiment of the present invention the burls are located in an arrangement determined to provide a more uniform supporting force than is afforded by a strictly regular grid or arranging burls on concentric rings. A method of determining a suitable arrangement of burls is described in US 2004247361. The method described therein can readily be adapted to increase the uniformity of supporting force in the vicinity of the e-pin apertures 24. In particular in an embodiment of the present invention the density (number of burls per unit area) is increased in the vicinity of the e-pin apertures, e.g. in the re-entrants compared to other regions e.g. in the center of the apparatus. In an embodiment of the invention the distribution of burls is also varied near the edge of the substrate holder to compensate for variable pressure effects in an immersion system. The distribution of burls in the vicinity of the edge of the substrate holder can be as described in US 2005219499.

In an embodiment, there is provided a substrate holder having: an upper surface; a plurality of burls located on and distributed across the upper surface, the burls being configured to support a substrate thereon; and a plurality of apertures in the substrate holder, the apertures being spaced apart from the center of the substrate holder; wherein at least one of the apertures has a shape at the upper surface of the substrate holder that includes at least one re-entrant, and at least one burl is located within the re-entrant.

In an embodiment, the shape of at least one of the aperture at the upper surface has at least one degree of symmetry and a plurality of re-entrants. In an embodiment, the shape of at least one of the aperture at the upper surface has two degrees of reflectional and/or rotational symmetry and four re-entrants. In an embodiment, at least one of the aperture is cross-shaped. In an embodiment, there are at least three apertures having shapes at the upper surface that include at least one re-entrant.

In an embodiment, there is provided a substrate table arranged to support a substrate holder, the substrate table comprising: a plurality of spaced apart e-pins; an actuator system for controlling a projection of each e-pin into and/or through a respective aperture in the substrate holder; wherein each e-pin has a tip portion at a distal end thereof and the cross-section of the tip portion in a plane parallel to an upper surface of the substrate holder has at least one re-entrant.

In an embodiment, the cross-section of each tip portion has at least one degree of symmetry and a plurality of re-entrants. In an embodiment, the cross-section of each tip portion has two degrees of reflectional and/or rotational symmetry and four re-entrants. In an embodiment, the cross-section of the tip portion is cross-shaped. In an embodiment, there are at least three e-pin.

In an embodiment, there is provided a lithographic apparatus comprising a substrate table as described herein and supported thereon a substrate holder as described herein.

In an embodiment, there is provided a device manufacturing method comprising using a lithographic apparatus to transfer a patent from a patterning device to a substrate wherein the lithographic apparatus comprises a substrate table as described herein and supported thereon a substrate holder as described herein.

As will be appreciated, any of the above described features can be used with any other feature and it is not only those combinations explicitly described which are covered in this application.

Furthermore, although the invention has been described above in the context of an immersion lithographic apparatus for convenience, it will be appreciated that the invention may be used in conjunction with any form of lithographic apparatus, e.g., so-called dry atmospheric lithographic apparatus, wherein there is only air or another gas between the projection system and the substrate being exposed, or vacuum lithographic apparatus as being used in extreme ultraviolet (EUV) lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

The descriptions above are intended to be illustrative, not limiting. Thus, it will be apparent to one skilled in the art that modifications may be made to the invention as described without departing from the scope of the claims set out below.

The invention claimed is:

1. A substrate table system, comprising:
a substrate holder having:
an upper surface,
a plurality of burls located on and distributed across the upper surface, the burls being configured to support a substrate thereon, and
an aperture in the substrate holder;
an e-pin having a tip portion at a distal end thereof;
an actuator system configured to control a projection of the e-pin into and/or through the aperture in the substrate holder,
wherein the aperture has a shape at the upper surface of the substrate holder that includes at least four re-entrants,
wherein the cross-section of the tip portion of the e-pin in a plane parallel to the upper surface of the substrate holder has a shape corresponding to the shape of the aperture that includes the at least four re-entrants, and
wherein at least one burl is located within at least one of the re-entrants.

2. A substrate table system according to claim 1, wherein the shape of the aperture at the upper surface has at least one degree of symmetry.

3. A substrate table system according to claim 2, wherein the shape of the aperture at the upper surface has at least two degrees of reflectional and/or rotational symmetry.

4. A substrate table system according to claim 1, wherein the aperture is cross-shaped.

5. A substrate table system according to claim 1, wherein there are at least three apertures in the substrate holder having shapes at the upper surface that include at least one re-entrant and wherein there at least three e-pins designed to project into and/or through the respective apertures in the substrate holder.

6. A substrate table system according to claim 1, wherein the substrate holder comprises a vacuum hole configured to communicate with a vacuum source via the substrate table and the vacuum hole has a shape with at least one re-entrant.

7. A substrate table system according to claim 1, wherein a raised wall or ridge surrounds, and follows an edge of, the aperture.

8. A lithographic apparatus comprising the substrate table system according to claim 1.

9. A device manufacturing method comprising:
using a lithographic apparatus to transfer a pattern from a patterning device to a substrate supported by a substrate holder, the substrate holder comprising an upper surface, a plurality of burls, located on and distributed across the upper surface, to support a substrate thereon, and an aperture in the substrate holder, the aperture having a shape at the upper surface of the substrate holder that includes at least four re-entrants, and at least one burl is located within at least one of the re-entrants; and
causing projection of an e-pin into and/or through the aperture in the substrate holder, the e-pin having a tip portion at a distal end thereof and the cross-section of the tip portion of the e-pin in a plane parallel to the upper surface of the substrate holder has a shape corresponding to the shape of the aperture that includes the at least four re-entrants.

10. A device manufacturing method according to claim 9, wherein the shape of the aperture at the upper surface has at least one degree of symmetry.

11. A device manufacturing method according to claim 10, wherein the shape of the aperture at the upper surface has at least two degrees of reflectional and/or rotational symmetry.

12. A device manufacturing method according to claim 9, wherein the aperture is cross-shaped.

13. A device manufacturing method according to claim 9, wherein there are at least three apertures in the substrate holder having shapes at the upper surface that include at least one re-entrant and wherein there at least three e-pins designed to project into and/or through the respective apertures in the substrate holder.

14. A device manufacturing method according to claim 9, further comprising attracting the substrate to the substrate holder using a vacuum hole of the substrate holder, wherein the vacuum hole has a shape with at least one re-entrant.

15. A device manufacturing method according to claim 9, wherein a raised wall or ridge surrounds, and follows an edge of, the aperture.

16. A substrate table system, comprising:
a substrate holder having:
an upper surface,
a plurality of burls located on and distributed across the upper surface, the burls being configured to support a substrate thereon, and
an aperture in the substrate holder;
an e-pin having a tip portion at a distal end thereof;
an actuator system configured to control a projection of the e-pin into and/or through the aperture in the substrate holder,
wherein the aperture has a shape at the upper surface of the substrate holder that includes at least one re-entrant,
wherein the cross-section of the tip portion of the e-pin in a plane parallel to the upper surface of the substrate holder has a shape corresponding to the shape of the aperture that includes the at least one re-entrant, and
wherein at least one burl is located within the at least one re-entrant such that it is closer to a center of the aperture than an imaginary line connecting two adjacent salients of the associated at least one reentrant and the at least one burl does not surround the aperture.

17. A substrate table system according to claim 16, wherein the shape has at least four reentrants.

18. A substrate table system according to claim 17, wherein the shape of the aperture at the upper surface has at least two degrees of reflectional and/or rotational symmetry.

19. A substrate table system according to claim 16, wherein a raised wall or ridge surrounds, and follows an edge of, the aperture.

20. A lithographic apparatus comprising the substrate table system according to claim 16.

* * * * *